United States Patent [19]
Weggel

[11] Patent Number: 5,629,616
[45] Date of Patent: May 13, 1997

[54] CIRCUIT FOR MEASURING CURRENT IN CLASS-D AMPLIFIERS

[75] Inventor: Craig R. Weggel, Willow Grove, Pa.

[73] Assignee: Performance Conrols, Inc., Horsham, Pa.

[21] Appl. No.: 501,957

[22] Filed: Jul. 13, 1995

[51] Int. Cl.[6] .................................................. G01R 31/28
[52] U.S. Cl. ........................... 324/127; 324/117; 324/726
[58] Field of Search ..................................... 324/126, 127, 324/140, 142, 537, 117, 726

[56] References Cited

U.S. PATENT DOCUMENTS

| | | | |
|---|---|---|---|
| 4,404,623 | 9/1983 | Jourdan | 363/56 |
| 4,542,440 | 9/1985 | Chetty et al. | 361/111 |
| 4,584,635 | 4/1986 | MacInnis et al. | 363/25 |
| 4,912,396 | 3/1990 | Groenenboom | 324/117 |
| 5,070,292 | 12/1991 | Goff | 318/811 |
| 5,081,409 | 1/1992 | Goff | 318/819 |
| 5,365,422 | 11/1994 | Close et al. | |
| 5,379,209 | 1/1995 | Goff | 363/98 |

FOREIGN PATENT DOCUMENTS 332737  3/1985  Germany .
000681435  8/1979  U.S.S.R. .
2202338  9/1988  United Kingdom .

Primary Examiner—Kenneth A. Wieder
Assistant Examiner—Barry C. Bowser
Attorney, Agent, or Firm—William H. Eilberg

[57] ABSTRACT

A circuit accurately measures the current flowing in a load which is powered by a pulse-width modulated (PWM) arrangement. The current measurement circuit is transformer-coupled to the load. A first flux cancellation device produces a voltage which tends to reduce the flux in the transformer core to zero. A pair of peak detection circuits determine maximum and minimum voltages at the output of the first flux cancellation device, and another circuit measures the difference between the maximum and minimum voltages. This difference is a voltage which is proportional to the current flowing in the load. A second flux cancellation device includes an integrator which integrates the outputs of the peak detection circuits, and the output of the integrator is fed back to the first flux cancellation device. The second flux cancellation device compensates for flux creepage in the transformer, and tends to maintain the flux at zero, so that distortion is minimized, and so that one can use a small and inexpensive transformer.

8 Claims, 1 Drawing Sheet

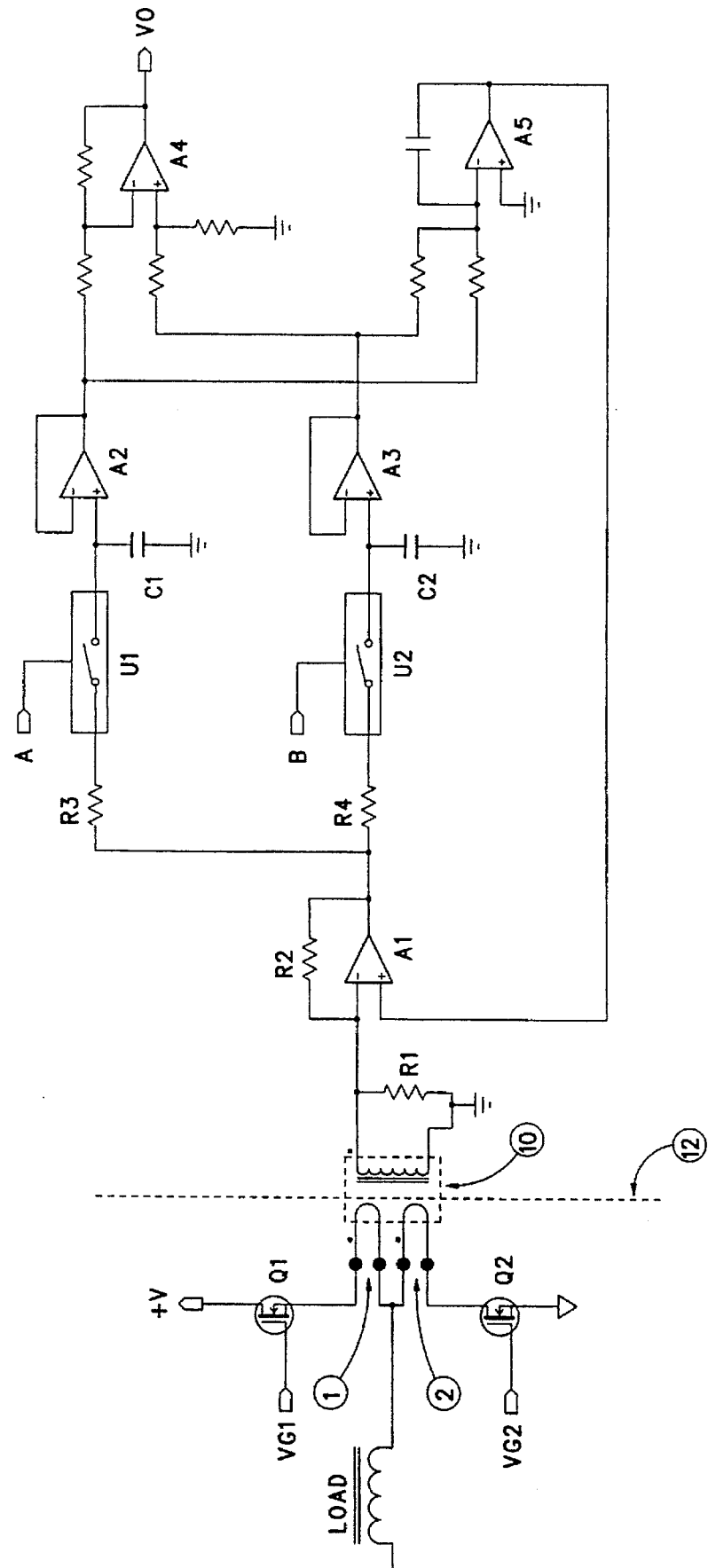

CIRCUIT FOR MEASURING CURRENT IN CLASS-D AMPLIFIERS

BACKGROUND OF THE INVENTION

This invention relates to the field of current measurement, particularly in the context of pulse-width-modulated (PWM) circuits. More specifically, the invention includes a circuit which provides an instantaneous and accurate measurement of current flowing through a load, while maintaining galvanic isolation between the measurement circuit and the load.

Examples of PWM circuits are shown in U.S. Pat. Nos. 5,070,292, 5,081,409, 5,379,209, and 5,365,422. The disclosures of all of the latter patents are hereby incorporated by reference into this specification. These patents give examples of circuits in which a series of pulses is used to control electronic switches which selectively connect a power supply to a load. The load can be an electric motor, or a coil used to produce a magnetic field, or some other load.

In PWM circuits of the types described in the above-cited patents, it is often necessary to monitor the current flowing through the load, either for purposes of overcurrent protection, or because one wants to control another circuit based on the measured current in the load, or for other reasons. Direct measurement of load current is undesirable because it requires that one insert an inductance or a resistance into the circuit being measured. The preferred means of current measurement is one which maintains galvanic isolation, i.e. insuring that no current flows directly between the load and the measuring circuit.

However, in the prior art, there are few techniques for measuring load current in a PWM circuit while maintaining galvanic isolation. While one could simply couple the load, through a transformer, to a conventional circuit for current measurement, the accumulation of magnetic flux in the transformer core accentuates the nonlinearity of the transformer and introduces inaccuracy into the final measurement. A solution to this problem is to use a larger transformer, because the larger the transformer, the less likely that the transformer core will become saturated, and the greater the range over which the transformer response is relatively linear. But using a larger transformer has the disadvantage of requiring a larger space, and it may also be unacceptably expensive.

The present invention provides accurate measurement of the current in a load, in a PWM circuit, using components that are both readily available and relatively inexpensive. The invention provides means for effectively maintaining the flux density in the transformer core at or near zero, so that distortion in the measurement is minimized.

SUMMARY OF THE INVENTION

The current measurement circuit of the present invention is especially intended for use in conjunction with a pulse-width modulation (PWM) circuit which applies current to a load. A transformer connected between the PWM circuit and the current measurement circuit provides galvanic isolation between the load and the measurement circuit.

The primary winding of the transformer is connected to the load. An operational amplifier, connected to the secondary winding, applies current to the secondary winding. The current applied to the secondary tends to cancel the current flow in that winding, so as to tend to minimize the magnetic flux in the transformer core. The output of the operational amplifier is connected to a pair of peak detection circuits which determine the maximum and minimum voltage excursions of that output. The outputs of the peak detection circuits are connected to an amplifier which produces a signal representative of the difference between the maximum and minimum voltage excursions. The latter difference signal is a voltage which is also proportional to the current flowing in the load.

The performance of the current measurement circuit is further improved by a feedback circuit which overcomes the tendency of the flux density in the transformer core to depart from zero. The feedback circuit includes an integrator which integrates the outputs of the peak detection circuits, such that any imbalance between the positive and negative peaks is converted into an error correction voltage that is fed back to the operational amplifier. The result is that the flux in the transformer is maintained essentially at zero, even when the net current flowing through the load is nonzero. Thus, the transformer is always operated in a domain in which its response is most nearly linear. By holding the flux in the transformer at zero, one can use a relatively small and inexpensive transformer without sacrificing accuracy of measurement.

The present invention therefore has the primary object of providing a circuit which measures the current flowing through a load.

The invention has the further object of measuring current flowing through a load, wherein the current is applied by a pulse-width modulation system.

The invention has the further object of enhancing the accuracy of measurement of current flowing in a load which is powered by a PWM circuit.

The invention has the further object of providing a current measurement circuit wherein the current measurement circuit can be referenced to a different voltage from that of the PWM circuit.

The invention has the further object of providing a current measurement circuit in which the current being measured is transformer-coupled to the measurement circuit, and wherein the transformer can be one which is relatively small and relatively inexpensive, due to the use of flux cancellation techniques.

The invention has the further object of providing a method of measuring current flowing in a load.

The reader will recognize other objects and advantages of the present invention, from a reading of the following brief description of the drawing, the detailed description of the invention, and the appended claims.

BRIEF DESCRIPTION OF THE DRAWING

The FIGURE provides a schematic diagram of the current measurement circuit according to the present invention.

DETAILED DESCRIPTION OF THE INVENTION

The left-hand portion of the FIGURE shows part of a pulse-width modulation (PWM) circuit which applies current to a load through an H-bridge. The H-bridge includes switches Q1 and Q2, and may include additional switches, as is known in the art, and as is described in the patents cited above. The power supply voltage, represented in the FIGURE as +V, is applied between the drain of Q1 and the source of Q2, as indicated. Note that the "ground" for the power supply is, in general, different from the "ground" for the measurement circuit on the right-hand side of the FIG- URE; these two "grounds" are therefore represented by different symbols.

Switch Q1 is controlled by voltage $V_{G1}$, applied to the gate of switch Q1. Similarly, switch Q2 is controlled by voltage $V_{G2}$, applied to the gate of switch Q2. Both $V_{G1}$ and $V_{G2}$ are preferably PWM signals which are derived in a conventional manner.

Transformer 10 is connected between the PWM circuit and the measurement circuit. Dotted line 12, which passes through the transformer, represents the isolation boundary between these two circuits. As indicated in the FIGURE, the primary windings of the transformer are connected to the PWM circuit, and to the load. There are two primary windings, namely winding 1 connected between Q1 and the load, and winding 2 connected between Q2 and the load. The dots near primary windings 1 and 2 indicate that current in the secondary winding will be bipolar, i.e. positive for the first half of the PWM cycle and negative for the second half. The latter arrangement helps to maintain an average flux of zero in the core of the transformer, but is not absolutely necessary for operation of the present invention.

The current measurement circuit includes resistor R1, operational amplifier A1, and resistor R2. Resistor R1 has a relatively small value, and provides a current path for high-frequency components, higher than the bandwidth of A1, and maintains a low impedance across the secondary winding. Amplifier A1 generates a voltage across R2 which tends to maintain a zero voltage across R1. The output of amplifier A1 is therefore representative of the current in the secondary winding of the transformer. More specifically, the magnitude of the voltage at the output of A1 is representative of the magnitude of the current flowing through the load, and the phase of the latter voltage is representative of the polarity of the current flowing through the load. As used herein, the term "phase" means the phase of a rectangular pulse. If current flows in one direction through the load, the pulses are positive-going and then negative going, while if current flows in the opposite direction, the pulses are negative-going and then positive-going.

Since the amplifier A1 applies a voltage across the secondary which tends to cancel the current in the secondary, the magnetic flux in the transformer core tends to be near zero.

However, since there is always a finite amount of error in the signal generated by amplifier A1, used to produce an opposing current, the magnetic flux in the transformer core is not completely cancelled. Moreover, in the case where the first half of the PWM cycle has a duration different from that of the second half of the PWM cycle, the flux is not cancelled because of this imbalance. In effect, there is a DC component in the signal flowing through the primary winding of the transformer. The lack of complete flux cancellation will result in "flux creepage" in the transformer core. Since flux is the integral, over time, of the sum of the induced voltages across all phases of the transformer, as shown by Faraday's law, and if the average value of volt-seconds across all phases of the transformer is nonzero, the flux will increase or decrease, depending on the polarity of the voltages, and will continue to increase or decrease for as long as there is an imbalance in volt-seconds. The latter problem is solved by a further mechanism for cancelling flux, described below.

The second flux cancellation mechanism includes two identical circuits for monitoring the peak excursions of the voltage signal at the output of amplifier A1. The first of these circuits includes U1, R3, C1, and A2; the second circuit includes U2, R4, C2, and A3. Element U1 is an electronic switch which is controlled by signal A. Element U2 is an electronic switch controlled by signal B. Signals A and B are derived from the PWM signals used to drive the H-bridge on the left-hand side of boundary 12.

In a first approximation, signal A could be the same as $V_{G1}$ and signal B could be the same as $V_{G2}$, i.e. the signals which drive the switches in the PWM circuit which applies current to the load. However, it is preferable to introduce a small time delay, of the order of one microsecond, to the PWM control signals $V_{G1}$ and $V_{G2}$, before using these signals to control switches U1 and U2. That is, in the preferred embodiment, signal A is signal $V_{G1}$ delayed by about one microsecond, and signal B is signal $V_{G2}$ delayed by the same amount. The reason for the time delay is that switches Q1 and Q2 require a finite time to open or close, following a change of state of the control signals $V_{G1}$ and $V_{G2}$. The peak detection circuits will perform most accurately only if switches U1 and U2 close after the corresponding main switch (Q1 or Q2) has fully closed.

The time delay can be implemented by conventional means, such as by using an R-C circuit. It can also be implemented with discrete logic, or with a microprocessor (or its equivalent) which counts through a predetermined time interval and closes an appropriate switch upon reaching a predetermined count.

The peak detection circuit comprising R3, U1, C1, and A2 operates as follows. When the switch U1 is closed, C1 is charged to the level of the voltage appearing at the output of amplifier A1. The value of C1 is sufficiently high that it can hold a charge for a period which is much longer than the average period of the PWM pulses. Thus, C1 "remembers" the last voltage applied to it. Operational amplifier A2 acts as a buffer, making it possible to drive the next stage (to be explained below) without discharging C1. The peak detection circuit comprising R4, U2, C2, and A3 operates in a similar manner.

Due to the manner of derivation of signals A and B, the two peak detection circuits measure the peak excursions of voltage, at the output of amplifier A1, in the positive and negative directions. The peak detection circuits detect the peaks correctly due to the fact that they are controlled by essentially the same signals which control the basic PWM circuit.

Amplifier A4 generates a signal $V_o$ proportional to the difference between the maximum positive and maximum negative voltages appearing at the outputs of amplifiers A2 and A3. Signal $V_o$ is therefore proportional to the actual current flowing through the load.

Operational amplifier A5 is configured as an integrator, and integrates the signals generated by amplifiers A2 and A3. Since A2 and A3 are normally of opposite polarity, and if the duty cycle is such that Q1 and Q2 are open and closed for the same amounts of time, there will be no net flux developed in the transformer core, the outputs of A2 and A3 will be equal and opposite, and the output of A5 will be zero. To the extent that the duty cycle varies from the above-described condition, the output of A5 will be nonzero, and will represent any DC component in the transformer. This output is fed back to amplifier A1, and therefore, by cancelling the DC component, maintains the average flux density in the core at zero. In effect, amplifier A5 senses the imbalance in volt-seconds between primary winding 1 (adjacent to Q1) and primary winding 2 (adjacent to Q2), and provides feedback which tends to cancel this imbalance.

There are several advantages in maintaining the flux in the transformer core at zero. The transformer exhibits a nonlinear relationship between current in the primary and current induced in the secondary, and this nonlinearity becomes especially pronounced at high levels of flux, when the transformer core approaches saturation. Moreover, these non-linearities are temperature-dependent. Maintaining the flux level near zero avoids or minimizes such problems.

Maintaining the flux at or near zero also has the advantage that it is feasible to use a relatively small transformer to achieve relatively high linearity, thus reducing the cost of the circuit, and reducing the space occupied by the circuit.

If one needs to monitor the current in the load for purposes of preventing an overcurrent condition, it is preferable to monitor the output of amplifier A1, instead of $V_o$. The reason is that the circuitry located beyond amplifier A1 adds a small amount of time delay. If one wants to monitor current with a virtually instantaneous response, the best results are obtained by monitoring the output of A1 directly.

It is possible to operate the circuit of the present invention with only one flux cancellation means, i.e. by omitting the integrator circuit. In this case, one would still use the peak detection circuits and the difference circuit associated with amplifier A4, and the second input of amplifier A1 would be connected to the bottom terminal of resistor R1 instead of to amplifier A5. Of course, the latter arrangement will not be as effective in cancelling flux as the circuit described above.

While the invention has been described with respect to a particular preferred embodiment, the invention can be modified in other ways, within the scope of the disclosure. The specific form of the amplifiers and switches can be varied. The invention can be used to measure load current in various kinds of circuits, and is not necessarily limited to use with an H-bridge. Such modifications, and others which will be apparent to those skilled in the art, should be considered within the spirit and scope of the following claims.

What is claimed is:

1. A circuit for measuring current flowing through a load, the circuit comprising:
    a) a transformer having primary and secondary windings, the primary winding being connected to the load,
    b) operational amplifier means, connected to the secondary winding, for applying a current to the secondary winding which current tends to cancel current in the secondary winding, the operational amplifier means having an output,
    c) peak detection means, connected to the output of the operational amplifier means, for determining maximum and minimum voltages appearing at the output of the operational amplifier means, the peak detection means having two outputs corresponding to a maximum positive voltage and a maximum negative voltage, and
    d) means for measuring a difference between the maximum positive and maximum negative voltages, wherein said difference is proportional to current flowing in the load,
    wherein current is applied to the load through electronic switches, the electronic switches being driven by control signals, and wherein the peak detection means include electronic switches controlled by signals which are derived from said control signals.

2. The circuit of claim 1, further comprising means for integrating the outputs of the peak detection means, the integrating means having an output which is connected to the operational amplifier means.

3. The circuit of claim 1, wherein the signals controlling the electronic switches in the peak detection means are time-delayed relative to the signals which control said electronic switches which apply current to the load.

4. A circuit for measuring current flowing through a load, the circuit comprising:
    a) transformer means having a primary winding and a secondary winding, the primary winding being connected to the load,
    b) first flux cancellation means connected to the secondary winding, the first flux cancellation means having an output,
    c) means for detecting maximum and minimum voltages at the output of the flux cancellation means, and
    d) means for determining a voltage representing a difference between maximum and minimum voltages detected by the detecting means, wherein said voltage is representative of current flowing through the load,
    wherein current is applied to the load through electronic switches which are controlled by control signals, and wherein the detecting means includes at least one electronic switching device which is controlled by a signal derived from said control signals.

5. The circuit of claim 4, wherein there is a second flux cancellation means, connected to the detecting means, the second flux cancellation means having an output connected to the first flux cancellation means.

6. The circuit of claim 4, wherein the signal controlling the electronic switching device is time-delayed relative to said control signals.

7. A method of measuring current flowing in a load in a pulse-width modulated (PWM) circuit, the method comprising the steps of:
    a) providing a transformer having primary and secondary windings, at least one primary winding being connected to the load,
    b) applying a current to the secondary winding of the transformer, which current tends to reduce magnetic flux in the transformer, the applying step being performed with an operational amplifier having an output,
    c) determining maximum and minimum voltages appearing at the output of the operational amplifier, and
    d) deriving a voltage proportional to a difference between said maximum and minimum voltages, wherein the deriving step yields a voltage which is proportional to current flowing through the load,
    wherein the PWM circuit includes electronic switches controlled by control signals, and wherein the determining step is performed by opening and closing a pair of secondary electronic switches, the opening and closing of the secondary electronic switches being controlled by signals derived from said control signals.

8. The method of claim 7, further comprising the step of integrating the maximum and minimum voltages to produce an integrated signal, and feeding said integrated signal back to the operational amplifier.

* * * * *